United States Patent [19]

Platzer

[11] Patent Number: 4,937,168

[45] Date of Patent: Jun. 26, 1990

[54] SOLID TRANSFER NEGATIVE- OR POSITIVE-WORKING COLOR PROOFING METHOD ON DIVERSE PAPER STOCKS

[75] Inventor: Stephan J. W. Platzer, Califon, N.J.

[73] Assignee: Hoechst Celanese Corporation, Somerville, N.J.

[21] Appl. No.: 261,373

[22] Filed: Oct. 21, 1988

[51] Int. Cl.$^5$ .................... G03C 7/20; G03C 11/12; G03F 3/06

[52] U.S. Cl. .................................. 430/143; 430/142; 430/257; 430/258

[58] Field of Search ................ 430/143, 142, 257, 258

[56] References Cited

U.S. PATENT DOCUMENTS

| | | | |
|---|---|---|---|
| 3,671,236 | 6/1972 | Van Beusekom | 430/143 |
| 3,721,557 | 3/1973 | Inoue | 430/143 |
| 4,262,071 | 4/1981 | Larson | 430/11 |
| 4,376,158 | 3/1983 | Spechler | 430/143 |
| 4,482,625 | 11/1984 | Namiki et al. | 430/143 |
| 4,650,738 | 3/1987 | Platzer et al. | 430/143 |
| 4,659,642 | 4/1987 | Platzer et al. | 430/143 |
| 4,666,817 | 5/1987 | Sachi | 430/143 |
| 4,719,169 | 1/1988 | Platzer et al. | 430/143 |

Primary Examiner—Charles L. Bowers, Jr.
Attorney, Agent, or Firm—Plottel & Roberts

[57] ABSTRACT

This invention relates to an improved negative- or positive-working, single sheet color proofing method which can accurately reproduce said images on diverse paper stocks by using a carrier to transfer the processed images to paper receiver bases. The final construction is useful in predicting the image quality from a lithographic printing process.

23 Claims, No Drawings

SOLID TRANSFER NEGATIVE- OR POSITIVE-WORKING COLOR PROOFING METHOD ON DIVERSE PAPER STOCKS

BACKGROUND OF THE INVENTION

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. However, this conventional method of color proofing is costly and time consuming.

Photoimaging processes can also be used to produce color proofs. There are two general types of photoimaging methods; namely the overlay type and the single sheet type.

In the overlay type of color proofing method, an independent transparent plastic support is used for producing an image of each color separation film by applying photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This is done by utilizing a single opaque support and by applying toners, transferring images, or processing solutions or coatings of photosensitive material of corresponding colors on the opaque support in succession. The single sheet method more closely resembles the actual printing process and eliminates the color distortion inherent in the overlay system.

An example of a negative-working, single sheet approach is described in U.S. Pat. No. 4,650,738. The presensitized element comprises a substrate having a release surface, a pigmented photosensitive layer in contact with the release surface, and a heat sensitive adhesive layer in contact with the photosensitive layer. The element is used by laminating it to receiver sheet via the adhesive, removing the substrate, exposing the photosensitive layer, and developing the image. The receiver sheet must be resistant to any adverse effects which may be caused by the developer of choice. For example, the receiver sheet should water resistant if aqueous developers are used. Normal paper printing stock would be a poor choice as a receiver sheet due to its tendency to disintegrate in aqueous solutions. Plastic receiver sheets are more useful for this purpose.

An example of a positive-working, single sheet approach is described in U.S. Pat. No. 4,659,642. The polymeric diazonium compound in the above negative-working element is replaced by a naphthoquinone diazide compound in the positive-working, presensitized element, while the other ingredients remain essentially the same. The positive-working element is processed in a like manner with an aqueous developer. Again the receiver sheet must be resistant to any adverse effects which may be caused by the developer.

The present invention relates to improved negative-working and positive-working proofing sheets of the solid layer transfer class. Color proofing films of this type are composed of a sheet substrate and at least a photosensitive member attached to the substrate. Development takes place after the photosensitive member is transferred.

SUMMARY OF THE INVENTION

The present invention provides an improved method for forming a colored image on degradable receiver sheets which comprises:

A. providing a photosensitive element which comprises, in order:
  (i) a substrate having a release surface; and
  (ii) a single, colored photosensitive layer on said release surface, which photosensitive layer comprises a light sensitive, component selected from the group consisting of negative-working, polymeric diazonium compounds or positive-working, naphthoquinone diazide compounds, or photopolymerizable compositions in an amount sufficient to photosensitize the layer; and a resinous binder composition in an amount sufficient to bind the layer components into a uniform film; and at least one colorant in an amount sufficient to uniformly color the layer; and
  (iii) an optional, nonphotosensitive, colorless adhesive layer directly adhered to said colored photosensitive layer, which adhesive layer has a softening point in the range of from about 60° C. to about 180° C.; and B. providing a carrier which comprises a self-supporting, transparent, heat and developer stable film; a heat sensitive, transparent adhesive layer disposed on one side of said film; and a removable interleaf adhered to said adhesive layer; and thereafter C. either
  (i) laminating said photosensitive element with heat and pressure via said photosensitive or adhesive layer of the photosensitive element to the nonadhesive side of the transparent film; and removing said substrate by the application of peeling forces; and imagewise exposing said photosensitive layer to actinic radiation; or
  (ii) imagewise exposing said photosensitive layer to actinic radiation; and laminating said photosensitive element with heat and pressure via said photosensitive or adhesive layer of the photosensitive element to the nonadhesive side of the transparent film: and removing said substrate by the application of peeling forces; or (iii) laminating said photosensitive element with heat and pressure via said photosensitive or adhesive layer of the photosensitive element to the nonadhesive side of the transparent film; and imagewise exposing said photosensitive layer to actinic radiation; and removing said substrate by the application of peeling forces; and thereafter D. removing the nonimage areas of said photosensitive layer with a liquid developer, which removing is conducted at a temperature at which said photosensitive element is substantially nontacky; and thereafter E. optionally repeating steps A through D at least once whereby another photosensitive element having at least one different colorant is laminated onto the nonremoved portions of the previously processed photosensitive layer or layers which are attached to the nonadhesive side of the transparent film; and thereafter F. optionally laminating a heat resistant protective sheet onto the nonremoved portions of the photosensitive layer; and thereafter G. removing said interleave and laminating said carrier to a degradable receiver sheet via said adhesive layer of the carrier; and thereafter H. optionally removing said protective sheet.

DETAILED DESCRIPTION OF THE PREFERRED EMBODIMENT

In carrying out the method of the invention, one employs a photosensitive element which broadly comprises a substrate having a release surface, a colored photosensitive layer on the release surface, and an optional adhesive layer on the photosensitive layer.

In the preferred embodiment, the substrate is composed of a dimensionally and chemically stable base material which does not significantly change its size, shape, or chemical properties as the result of the heating, coating, or other treatments which it must undergo. One preferred material is polyethylene terephthalate. In the usual case, it has a thickness of from about 1 to about 10 mils, a more preferred thickness is from about 2 to about 5 mils and most preferably from about 2 to about 3 mils. Suitable films include Hostaphan 3000 available from Hoechst Celanese Corporation; Mylar D available from DuPont and Melinex 516 available from ICI. The surface of the substrate may be smooth or may be provided with a matte texture by various methods known in the art.

Matte films include Melinex 377 and 470 from ICI. These materials have the unique property of giving the final image a desired matte finish without any extra steps. One can control the gloss of the final image by properly selecting the matte finish of the temporary support. This effect works because the top layer of the final image is originally in contact with this matte surface. An additional advantage of coating on a matte surface is that subsequent transferred layers generally adhere better to a rough surface than to a smooth surface.

A similar matte finish of the final image can be obtained by embossing the top surface of the image with a matte material, such as described above. This is done by laminating together the final image and matte material with heat and pressure. The matte material is then generally removed after lamination. The advantage of this method is that the finish of the final proof can be varied. Furthermore, the matting material can be used repeatedly.

A third method for producing a matte finish uses a heat transferable layer, such as Butvar 90 available from Monsanto, coated onto a film with a rough surface, such as Melinex 329 available from ICI. The transferable layer is laminated to the final image with heat and pressure. Then the film with the rough surface is peeled off. The rough surface imparts a matte finish to the final image. An additional advantage is that the extra layer protects the image. U.S. Pat. Nos. 4,294,909 and 4,376,159 also suggest various methods for making a matte surface.

The substrate must have a release surface, that is, it must be capable of releasably holding the photosensitive layer thereto. This may be accomplished by the substrate surface being either inherently releasable, rendered releasable by a suitable treatment, or provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, stabilizers, surfactants, antistatic compositions, uv absorbers, optical brighteners, inert fillers, photoactivators, spectral sensitizers, antihalation agents, hydrogen atom donors, exposure indicators, polymerization inhibitors, and residual coating solvents.

In one embodiment, the photosensitizer is preferably a light sensitive, negative-working polymeric diazonium salt. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, the photosensitizer is preferably a light sensitive, positive-working naphthoquinone diazide. The most preferred photosensitizer is the ester of bis-(3-benzoyl-4,5,6 trihydroxy phenyl)-methane and 2-diazo-1-naphthol-5-sulfonic acid as taught in U.S. Pat. No. 4,407,926. Other suitable photosensitizers are taught in U.S. Pat. Nos. 3,106,365; 3,148,983; 3,201,239; and 4,266,001. The diazo compounds of choice are preferably soluble in organic solvents.

In yet another embodiment, the photosensitizer comprises a photopolymerizable monomer or oligomer component, and a photoinitiator. Examples of such photosensitizers are given in U.S. Pat. No. 4,596,757. The photopolymerizable material contained in the color layer usually comprises an addition polymerizable, non-gaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Dyes may be included to spectrally sensitize the photoinitiator, such as described in U.S. Pat. Nos. 4,282,309 and 4,454,218, and European Patent Applications Nos. 0,179,448 and 0,211,615.

Other ingredients which may be present in the photosensitive layer are the acid stabilizers, exposure indicators, thermal polymerization inhibitors, plasticizers, oligomers, residual solvents, surfactants, inert fillers, antihalation agents, hydrogen atom donors, photoactivators, and optical brightening agents.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5 to about 70 by weight; or more preferably from about 10 to about 50 by weight.

In the practice of the present invention, when a photoinitiator compound is used, it is preferably present in the photosensitive layer in a amount sufficient to initiate the free radical polymerization of the unsaturated component upon exposure to imaging energy. It is preferably present in an amount ranging from about 2% to about 30% based on the weight of the solids in the layer. A more preferred range is from about 6% to about 20%.

In the practice of the present invention, the colorant component is preferably present in an amount sufficient to uniformly color the photosensitive layer. It is preferably present in an amount ranging from about 5% to about 50% based on the weight of the solids in the layer. A more preferred range is from about 10% to about 40%.

In the practice of the present invention, when an unsaturated component is used, it is preferably present in the photosensitive layer in an amount sufficient to cause an imagewise latent differential in the polymerizable composition when it is coated on a substrate and imagewise exposed to imaging energy. It is preferably present in an amount ranging from about 10% to about 60% based on the weight of the solids in the layer. A more preferred range is from about 15% to about 40%.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric, and p-toluene sulfonic acid, and mixtures thereof. Preferably, the acid stabilizer is phosphoric acid.

Exposure indicators (or photoimagers) which may be useful in conjunction with the present invention include 4-phenylazodiphenylamine, eosin, azobenzene, Calcozine Fuchine, Crystal Violet, and Methylene Blue dyes. Preferably, the exposure indicator is 4-phenylazodiphenylamine.

A plasticizer may also be included in the composition of this invention to prevent coating brittleness and to keep the composition pliable if desired. Suitable plasticizers include dibutylphthalate, triarylphosphate and substituted analogs thereof and preferably dioctylphthalate.

To form a coating composition for the production of the photosensitive elements, the composition of this invention may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate. However, some insignificant amount of solvent may remain as residue.

In the preferred embodiment, the photosensitive layer has a coating weight between approximately 0.1 and 5.0 g/m$^2$. The most preferred weight is from about 0.5 to 2.0 g/m$^2$.

The purpose of the optional adhesive layer on the photosensitive layer is to aid in the transfer of the photosensitive layer and to protect the integrity of underlying, previous formed images during development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The optional adhesive layer on the photosensitive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer. Useful polyvinyl acetates nonexclusively include Mowilith DM-6, DM-22, 20, 25, 30 and mixtures thereof, available from Hoechst AG. These are usually dispersed in water, or dissolved in methyl isobutyl ketone o n-butyl acetate or other solvent compositions for coating on a photosensitive layer. It is then dried to a coating weight of from about 2 to about 30 g/m$^2$, more preferably from about 4 to about 20 g/m$^2$. The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS ½, available from Hercules. The adhesive layer should not be tacky to the touch, during storage or during development of the photosensitive element. The layer should be transferable in the range of from about 60° C. to about 180° C., preferably 60° C. to 120° C., more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations by weight for the photosensitive element nonexclusively include:

| I. water | 50.00 |
|---|---|
| Mowilith DM-22 | 50.00 |
| II. n-butyl acetate | 78.00 |
| Resoflex R-296 | 1.00 |
| Mowilith 30 | 21.00 |
| III. n-butyl acetate | 68.70 |
| Uvinul D-50 | 1.30 |
| Mowilith 20 | 30.00 |
| IV. n-butyl acetate | 85.00 |
| Mowilith 60 | 15.00 |

The carrier according to the present invention uses a transparent, colorless self-supporting, heat and developer resistant film, preferably an organic polymer film, of between about 0.7 to about 5 mils in thickness. Preferably the layer is between about 1 to about 4 mils, and most preferably between about 1.5 and about 3 mils. The composition of this layer is unimportant. One preferred material is polyethylene terephthalate. Suitable films include Melinex 054, 504, 505, 582 available from ICI; and Hostaphan 4400, 4500, and 4540 available from Hoechst Celanese Corporation. The films are preferably adhesion promoted on both sides. Examples of adhesion pretreatment subbing layers are disclosed in U.S. Pat. No. 2,627,088.

On one side of the transparent film of the carrier is a transparent, heat sensitive adhesive layer. The adhesive is preferably colorless and developer resistant. This layer comprises a major amount of one or more thermoplastic polymers. Virtually any thermoplastic polymer may be used for this purpose provided it permits the release by peeling of the interleave member and is capable of adhering through a heated lamination to a receiver sheet as hereinafter described. Dry coating weights of from about 2 to about 30 g/m$^2$ are preferred, more preferably from about 4 to about 20 g/m$^2$. Suitable thermoplastic polymers nonexclusively include those previously described for the adhesive layer of the photosensitive element. Other suitable thermoplastic polymers include ethylene/vinyl acetate copolymers such as Elvax 40-W and 150-W available from DuPont. Typical adhesive formulations by weight for the carrier nonexclusively include:

| I. n-butyl acetate | 78 |
|---|---|
| Resoflex R-296 | 1 |
| Mowilith 30 | 21 |
| II. toluene | 90 |
| Elvax 150 | 10 |
| III. methyl ethyl ketone | 90 |
| Hostaflex CM 133 | 10 |

Releasably adhered to the adhesive layer is an interleaf member. Such can be virtually any material provided it is resistant to the developer and removable from the adhesive layer by peeling even after a lamination treatment and cooling. The dot gain can be influenced by the reflective nature of the interleave. Minimal dot gain in negative-working systems is obtained with transparent films, such as Melinex XRB available from ICI. High dot gain is obtained with white opaque films, such as Melinex 329 available from ICI. Other suitable interleaf members may be the same as the substrate for the photosensitive element which substrate has a release surface.

In operation, the photosensitive element is laminated to the nonadhesive side o the transparent film of the carrier via the photosensitive or adhesive layer of the photosensitive element. Lamination may be conducted by putting together the photosensitive element and carrier in the proper configuration and then introducing the two materials into the nip of a pair of heated laminated rollers under suitable pressure. Suitable laminating temperatures usually range from about 60° C. to about 180° C., preferably about 60° to about 120° C.. After lamination, the substrate is peeled away, usually merely employing manual peeling forces. The photosensitive layer plus the adhesive layer of the photosensitive element when used thus remains on the transparent film of the carrier.

The photosensitive layer is imagewise exposed by means well known in the art either before or after lamination. Such exposure may be conducted by exposure to a uv light source through a color separation under vacuum frame conditions. Exposures after lamination and peel apart are preferred for photosensitive layer-to-emulsion contact. Mercury vapor discharge lamps are preferred over metal halide lamps. Other radiation sources, such as carbon arc, pulsed xenon, and lasers, may also be used. Light absorbing filters may be used to reduce light scattering in the material.

After transfer and exposure, the photosensitive layer is developed by dissolving the nonimage areas in a suitable developer and dried. Suitable developers nonexclusively include:

| I. water | 95.0 |
|---|---|
| sodium decyl sulphate | 3.0 |
| disodium phosphate | 1.5 |
| sodium metasilicate | 0.5 |
| II. water | 89.264 |

| | |
|---|---|
| monosodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan. Development is performed at temperatures below that at which the photosensitive element is nontacky.

The process can then be repeated whereby another photosensitive element having a different color is laminated to the same carrier over the previous formed image. In the usual case, four colored layers are employed to produce a full color reproduction of a desired image. These are cyan, magenta, yellow and black.

In the construction of color proofs, it is sometimes desired to preview the image on the identical receiver sheet paper stock on which the printing is actually to be done. One therefore desires to laminate the thusly produced four color image with its carrier to the receiver stock. Normal paper stock generally cannot withstand the developing steps. Therefore, the processed photosensitive on its carrier is attached to paper after development. This is done by peeling away the interleaf of the carrier, thereby laying open the adhesive layer on the carrier. This adhesive layer is then laminated to the receiver stock. A protective layer may be used with the processed photosensitive layers either before or after lamination of the carrier to the receiver. Such protective sheets nonexclusively include any of the above substrate materials with a release surface or can be a material described in U.S. Pat. No. 4,719,169. Nontransparent protective sheets can be used provided they are subsequently peeled away after the receiver sheet is attached. Lamination conditions are as previously described.

The receiver sheet should be resistant to any adverse effects which may be caused by the lamination. For example, paper or coated paper receiver sheets are useful for this purpose. White and nonwhite, rough and smooth receiver sheets may be used.

The following nonlimiting examples serve to illustrate the invention.

EXAMPLE 1

Four photosensitive solutions of cyan, yellow, magenta, and black are produced according to the following photosensitive formulations:

| | Cyan | Yellow | Magenta | Black |
|---|---|---|---|---|
| methyl cellosolve | 41.00 | 41.00 | 46.50 | 41.00 |
| methyl ethyl ketone | 41.00 | 40.99 | 46.48 | 41.00 |
| gamma-butyrolactone | 10.00 | 10.00 | — | 10.00 |
| dimethyl phthalate | 0.75 | 0.75 | 0.88 | 0.75 |
| dibutyl phthalate | 0.25 | 0.25 | — | 0.25 |
| p-toluene sulfonic acid | — | — | 0.18 | 0.35 |
| Scripset 540 | 3.33 | 2.60 | 3.15 | 3.71 |
| Scripset 550 | 1.17 | — | — | — |
| hydrolyzed Scripset 540 | — | — | 0.67 | — |
| SMA 2625 | — | 2.02 | — | — |
| Above diazo from U.S. Pat. No. 3,849,392 | 1.33 | 1.35 | 0.70 | 2.00 |
| phthalo blue pigment | 1.17 | — | — | — |
| yellow pigment | — | 1.04 | — | — |
| magenta pigment | — | — | 1.44 | — |
| black pigment | — | — | — | 0.94 |

| | Cyan | Yellow | Magenta | Black |
|---|---|---|---|---|
| optical density | 1.1 | 0.9 | 1.2 | 1.5 |

Scripset resins are available from Monsanto. SMA resins are available from Arco.

The pigment is introduced as a dispersion of methyl ethyl ketone, Scripset 540, and the appropriate pigment. The solutions are coated and dried separately to the required optical density onto 3 mil Melinex 516 polyester films as substrates. The surface densities are roughly 1.3 g/m$^2$ for cyan, 0.9 g/m$^2$ for yellow, 1.8 g/m$^2$ for magenta, and 1.2 g/m$^2$ for black. The adhesive solution, in particular adhesive formulation II as described above for the photosensitive layer, is coated on top of the photosensitive layers and dried to a surface density of 12 g/m$^2$. The yellow composite is then laminated at 80° C. With the adhesive side of the photosensitive element to the nonadhesive side of a carrier. The carrier consists of an adhesive layer coated to a dry coating weight of 12 g/m$^2$ using formulation I for the carrier on a 3 mil Melinex 505 polyester film. This adhesive layer is covered with an interleave of 3 mil Melinex 516 polyester. The 516 support is peeled away after lamination, leaving the adhesive and photosensitive layers on the carrier. The yellow photosensitive layer is then exposed to actinic light through a photographic separation for the yellow color. The carrier with the exposed yellow layer is then immersed for 15 seconds in developer formulation II as described above at 27° C. with gentle pad rubbing on the photosensitive side. The nonexposed, yellow areas are thereby washed off and the exposed areas remain during development. The adhesive layer is no effected by the developer. After this treatment, the imaged material is rinsed and then dried. The magenta composite is then laminated as before onto the imaged, yellow side of the carrier. The substrate is removed as before. The magenta layer is then exposed through the magenta separation. It is then processed as with the yellow. The magenta is followed in a like manner by cyan and then by black. The interleaf is removed from the carrier. The adhesive layer from the carrier is laminated to Mead 2S(70) paper. A 0.9 mil Melinex 377 polyester sheet is used to prevent the processed photosensitive elements from adhering to the hot, nip rollers during lamination. After lamination, a four color image with a protective matte finish is produced which is an accurate representation of the original from which the separations are prepared.

EXAMPLE 2

Four photosensitive solutions of cyan, yellow, magenta, and black are produced according to the following photosensitive formulations:

| | Cyan | Yellow | Magenta | Black |
|---|---|---|---|---|
| diacetone alcohol | — | 11.74 | — | — |
| methyl ethyl ketone | 35.52 | 34.45 | 24.23 | 38.62 |
| gamma butyrolactone | 22.60 | 11.15 | 24.04 | 5.74 |
| Dowanol PM | 34.76 | 35.21 | 44.94 | 48.34 |
| Scripset 540 | 1.60 | 2.01 | 2.15 | 2.39 |
| SMA 2625 | 1.74 | 1.17 | — | 0.60 |
| Butvar B-90 | 0.58 | 0.59 | 0.67 | 0.30 |
| Above diazo from U.S. Pat. No. 4,407,426 | 2.09 | 2.58 | 2.81 | 2.72 |
| phthalo blue pigment | 1.11 | — | — | — |
| yellow pigment | — | 1.08 | — | — |
| magenta pigment | — | — | 1.15 | — |
| black pigment | — | — | — | 1.29 |

-continued

|  | Cyan | Yellow | Magenta | Black |
|---|---|---|---|---|
| optical density | 1.2 | 1.0 | 1.4 | 1.6 |

Scripset and Butvar resins are available from Monsanto, SMA resin is available from Arco, and Dowanol PM is propylene glycol monomethyl ether available from Dow.

The pigment is introduced as a dispersion of methyl ethyl ketone, Scripset 540, and the appropriate pigment. The solutions are coated and dried separately to the required optical density onto 3 mil Melinex 516 polyester films as substrates. The surface densities are roughly 1.2 g/m$^2$ for cyan, 1.4 g/m$^2$ for yellow, 2.0 g/m$^2$ for magenta, and 1.0 g/m$^2$ for black. The adhesive solution, in particular adhesive formulation II as described above for the photosensitive layer, is coated on top of the photosensitive layers and dried to a surface density of 12 g/m$^2$. The yellow composite is then laminated at 80° C. with the adhesive side of the photosensitive element to the nonadhesive side of a carrier. The carrier consists of an adhesive layer coated to a dry coating weight of 6 g/m$^2$ using formulation II for the carrier on a 2.3 mil Melinex 582 polyester film. This adhesive layer is covered with an interleaf of 7 mil Melinex 329 white polyester. The 516 substrate is peeled away after lamination, leaving the adhesive and photosensitive layers on the carrier. The yellow photosensitive layer is then exposed to actinic light through a photographic separation for the yellow color. The carrier with the exposed yellow layer is then immersed for 15 seconds in developer formulation II as described above at 27° C. with gentle pad rubbing on the photosensitive side. The exposed, yellow areas are thereby washed off and the nonexposed areas remain during development. The adhesive layer is not affected by the developer. After this treatment, the imaged material is rinsed and then dried. The magenta composite is then laminated as before onto the imaged, yellow side of the carrier. The substrate is removed as before. The magenta layer is then exposed through the magenta separation. It is then processed as with the yellow. The magenta is followed in a like manner by cyan and then by black. The interleaf is removed from the carrier. The adhesive layer from the carrier is next laminated to Champion Kromekote 1S paper. The interleaf 329 is used to prevent the processed photosensitive elements from adhering to the hot, nip rollers during lamination. After lamination, the 329 is again removed, giving a four color proof with a matte finish which is an accurate representation of the original from which the separations are prepared.

What is claimed is:

1. A method for forming a colored image which comprises:
   A. providing a photosensitive element which comprises, in order:
      (i) a substrate having a release surface; and
      (ii) a single photosensitive layer on said release surface, which photosensitive layer comprises a light sensitive component selected from the group consisting of negative-working, polymeric diazonium compounds, or positive-working naphthoquinone diazide compounds, or photopolymerizable compositions in an amount sufficient to photosensitize the layer; and a resinous binder composition in an amount sufficient to bind the layer components into a uniform film; and at least one colorant in an amount sufficient to uniformly color the layer; and
      (iii) an optional, nonphotosensitive adhesive layer directly adhered to said colored photosensitive layer, which adhesive layer has a softening point in the range of from about 60° C. to about 180° C.; and
   B. providing a carrier which comprises a self-supporting, transparent, heat and developer stable film; a heat sensitive, transparent adhesive layer disposed on one side of said film; and a removable, heat and developer stable interleaf adhered to said adhesive layer; and thereafter
   C. either
      (i) laminating said photosensitive element with heat and pressure via said photosensitive or adhesive layer of the photosensitive element to the nonadhesive side of the transparent film; and removing said substrate by the application of peeling forces; and imagewise exposing said photosensitive layer to actinic radiation to thereby form image areas in either the exposed or unexposed areas and oppositely nonimage areas in either the unexposed or exposed areas; or
      (ii) imagewise exposing said photosensitive layer to actinic radiation to thereby form image areas in either the exposed or unexposed area and oppositely nonimage areas in either the unexposed or exposed areas; and laminating said photosensitive element with heat and pressure via said photosensitive or adhesive layer of the photosensitive element to the nonadhesive side of the transparent film; and removing said substrate by the application of peeling forces; or
      (iii) laminating said photosensitive element with heat and pressure via said photosensitive or adhesive layer of the photosensitive element to the nonadhesive side of the transparent film; and imagewise exposing said photosensitive layer to actinic radiation to thereby form image areas in either the exposed or unexposed areas and oppositely nonimage areas in either the unexposed or exposed areas; and removing said substrate by the application of peeling forces; and thereafter
   D. removing the nonimage areas of the photosensitive layer with a liquid developer, which removing is conducted at a temperature at which said photosensitive element is substantially nontacky; and thereafter
   E. optionally repeating steps A, C and D at least once whereby another photosensitive element according to step A having at least one different colorant is laminated onto the nonremoved image portions of the previously processed photosensitive layer or layers such that after repetition of steps C and D, the non-removed image areas from said another photosensitive element are disposed on the non-removed image portions of the previously processed photosensitive layer, which are attached to the nonadhesive side of the transparent film; and thereafter
   F. optionally laminating a heat resistant protective sheet onto the nonremoved portions of the photosensitive layer; and thereafter
   G. removing said interleaf and laminating said carrier via said adhesive of the carrier to a degradable receiver sheet; and thereafter H. optionally removing said protective sheet.

2. The method of claim 1 where said substrate comprises polyethylene terephthalate.

3. The method of claim 1 wherein said substrate has a matte surface.

4. The method of claim 1 wherein said release surface on said substrate comprises polyvinyl alcohol.

5. The method of claim 1 wherein said diazonium salt in the photosensitive layer comprises the polycondensation product of 3-methoxy-4-diazo-diphenyl amine sulfate and 4,4'-bis-methoxy methyl-diphenyl ether precipitated as mesitylene sulfonate.

6. The method of claim 1 wherein said naphthoquinone diazide in the photosensitive layer comprises the ester of bis-(3-benzoyl-4,5,6 trihydroxy phenyl)-methane and 2-diazo-1-naphthol-5-sulfonic acid.

7. The method of claim 1 wherein said photosensitive layer comprises a photoinitiator and a polymerizable monomer.

8. The method of claim 7 wherein said photoinitiator comprises one or more compounds selected from the group consisting of 2,3-di(4-methoxyphenyl) quinoxaline, 9-phenyl acridine, bis (2,4,5-triphenyl)imidazole, and their derivatives.

9. The method of claim 7 wherein said polymerizable monomer comprises one or more compounds selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

10. The method of claim 1 wherein said binders in the photosensitive layer comprises one or more compounds selected from the group consisting of polyvinyl acetals; styrene/maleic anhydride copolymers; copolymers and their half esters; and acrylic resins.

11. The method of claim 1 wherein said photosensitive layer further comprises one or more ingredients selected from the group consisting of plasticizers, stabilizers, antistatic compositions, uv absorbers, spectral sensitizers, optical brighteners, inert fillers, exposure indicators, polymerization inhibitors, oligomers, surfactants, hydrogen atom donors, antihalation agents, and photoactivators.

12. The method of claim 1 wherein the coating weight of the photosensitive layer ranges from about 0.1 to 5.0 g/m$^2$.

13. The method of claim 1 wherein said optional adhesive layer of the photosensitive element comprises one or more thermoplastic polymers.

14. The method of claim 1 wherein said optional adhesive layer of the photosensitive element comprises one or more ingredients selected from the group consisting of plasticizers, uv absorbers, antistatic compositions, inert fillers, antihalation agents, and optical brighteners.

15. The method of claim 1 wherein said optional adhesive layer of the photosensitive element has a coating weight of from about 2 to about 30 g/m$^2$.

16. The method of claim 1 wherein said transparent film has a thickness of from about 0.7 to about 5 mils.

17. The method of claim 1 wherein said transparent film comprises polyethylene terephthalate.

18. The method of claim 1 wherein the adhesive layer on the carrier comprises one or more thermoplastic polymers.

19. The method of claim 1 wherein said adhesive layer of the carrier further comprises one or more ingredients selected for the group consisting of plasticizers, uv absorbers, antistatic compositions, inert fillers, antihalation agents, and optical brighteners.

20. The method of claim 1 wherein said adhesive layer of the carrier has a coating weight of from about 2 to about 30 g/m$^2$.

21. The method of claim 1 wherein said interleaf comprises a polymeric sheet having a release surface, which release surface is in direct contact with said adhesive layer of the carrier.

22. The method of claim 1 wherein said receiver sheet comprises paper or coated paper.

23. The method of claim 1 wherein the laminating step is conducted at a temperature of from about 60° C. to about 180° C.

* * * * *